(12) United States Patent
Hsu

(10) Patent No.: US 10,725,521 B2
(45) Date of Patent: Jul. 28, 2020

(54) POWER SAVING DEVICE CAPABLE OF AUTOMATICALLY SENSING STANDBY CURRENT

(71) Applicant: PROLIFIC TECHNOLOGY INC., Taipei (TW)

(72) Inventor: Chia-Chang Hsu, Hsinchu County (TW)

(73) Assignee: Prolific Technology Inc. (TW)

(*) Notice: Subject to any disclaimer, the term of this patent is extended or adjusted under 35 U.S.C. 154(b) by 86 days.

(21) Appl. No.: 16/182,742

(22) Filed: Nov. 7, 2018

(65) Prior Publication Data
US 2019/0227615 A1    Jul. 25, 2019

(30) Foreign Application Priority Data
Jan. 24, 2018   (TW) .............................. 107102472 A

(51) Int. Cl.
| G06F 1/32 | (2019.01) |
| G06F 1/3206 | (2019.01) |
| G01R 19/165 | (2006.01) |
| G01K 1/14 | (2006.01) |
| G01K 3/00 | (2006.01) |
| H02H 1/00 | (2006.01) |

(52) U.S. Cl.
CPC .............. *G06F 1/3206* (2013.01); *G01K 1/14* (2013.01); *G01K 3/005* (2013.01); *G01R 19/16547* (2013.01); *H02H 1/0007* (2013.01); *H02H 1/0092* (2013.01)

(58) Field of Classification Search
CPC ........ G06F 1/3202; G06F 1/3231; G06F 1/26; G06F 1/206; G06F 1/3228; G06F 1/08; G06F 1/3289; G06F 1/266; H04L 12/12; H04L 12/10
See application file for complete search history.

(56) References Cited

U.S. PATENT DOCUMENTS

| 2004/0070275 A1* | 4/2004 | Niv ........................... H02J 3/06 307/39 |
| 2009/0278602 A1* | 11/2009 | Matalon ................... H03F 1/526 330/255 |
| 2010/0185841 A1* | 7/2010 | Monreal .................. G06F 13/37 713/2 |
| 2013/0124892 A1* | 5/2013 | Lu ............................. G06F 1/30 713/322 |

(Continued)

*Primary Examiner* — Zahid Choudhury

(57) ABSTRACT

The invention discloses a power saving device capable of automatically sensing standby current, which is used in a power device such as a power outlet or other power supply devices for giving the power device ability of electricity saving. When the power saving device normally works, a threshold current setting unit of a controlling and processing module is configured to automatically calculate a threshold current based on current signals sensed by a current detecting unit under different operation modes of at least one electrical device electrically connected to the power device. Moreover, when at least one standby current sensed from the electrical device is determined to be lower than the threshold current, the controlling and processing module immediately switches a switch unit to an open-circuit state, thereby causing the electrical device unable to receive electricity from the power device. Consequently, the power device exhibits the ability of power saving.

20 Claims, 10 Drawing Sheets

(56) References Cited

U.S. PATENT DOCUMENTS

| | | | | |
|---|---|---|---|---|
| 2013/0322138 | A1* | 12/2013 | Atkinson | G06F 1/26 |
| | | | | 363/74 |
| 2016/0111963 | A1* | 4/2016 | Oyama | H02M 3/33523 |
| | | | | 363/21.15 |
| 2019/0146569 | A1* | 5/2019 | Nge | G06F 1/329 |
| | | | | 713/320 |

* cited by examiner

POWER SAVING DEVICE CAPABLE OF AUTOMATICALLY SENSING STANDBY CURRENT

BACKGROUND OF THE INVENTION

1. Field of the Invention

The present invention relates to the technology field of power saving devices, and more particularly to a power saving device capable of automatically sensing standby current.

2. Description of the Prior Art

With the high development of modern technologies, household appliances and electronic products have been widely used in human life, and are absolutely necessary for modern people. For simultaneously making a variety of household appliances or electronic products operate, electrical cables of these load devices are electrically connected to a power extension wire with a plurality of outlet sockets. Consequently, in the case of the load devices still receiving AC mains from the power extension wire at their standby state, it is important to notice the power waste induced from the standby power consumption of the load devices as well as the safe electricity using of the load devices.

FIG. 1 shows a stereo diagram of a commercial power extension wire with multi outlet sockets. Concerning to safe electricity using and power saving, the commercial power extension wire 1a is additionally equipped with at least one switch 11a, thereby facilitating people to enable or disable the supplying of the AC mains for the household appliances or the electronic products electrically connected to the power extension wire 1a. Actually, however, people always turn off their household appliances or electronic products by operating remoter, and neglect to press the switch 11a on the power extension wire 1a for stopping the supplying of the AC mains. As a result, such user habit causes the household appliances or the electronic products electrically connected to the power extension wire still produce standby power consumption at their standby state, thereby causing electricity waste as well as shortening service time of the load devices.

In view of that, a newly power extension wire having power saving function is further developed by power product manufacturers. FIG. 2 shows a stereo diagram of the power extension wire having power saving function, and an inner circuit topology of the power extension wire having power saving function is shown in FIG. 3. From FIG. 2 and FIG. 3, it is able to know that the power extension wire 3' comprising: an electrical plug 39', an over-current protection (OCP) unit 40', a surge protection unit 37', a voltage regulator unit 38', a power-saving controlling unit 33', a primary outlet socket 31', and a plurality of secondary outlet socket 32', wherein the voltage regulator unit 38' is used for converting a 110-volt voltage to a 5-volt voltage for driving a relay 331' of the power-saving controlling unit 33'.

Inductor L' and reed switch 332' arranged in the power-saving controlling unit 33' give the power extension wire 3' a functionality to carry out power saving. When the primary outlet socket 31' provides AC mains steadily, a driving current outputted by the primary outlet socket 31' would pass through the inductor L'. It is worth noting that, the reed switch 332' would be switched to an short-circuit state by a magnetic force induced by the inductor L' in the case of the driving current being greater than a threshold current. Consequently, the relay 331' is switch to a short-circuit state, such that the secondary outlet sockets 32' are given ability to supply the AC mains. On the contrary, when the primary outlet socket 31' stops supplying the AC mains, the reed switch 332' would be switched to an open-circuit state and the relay is simultaneously switched to an open-circuit state, thereby withdrawing the AC mains coupled to the secondary outlet sockets 32'.

From FIG. 3, engineers skilled in design and development of electronic circuits should find that the power extension wire 3' may exhibit following drawbacks during the execution of power saving:

(1) The amplitude of the driving current would vary with the different kinds of electrical devices electrically connected to the primary outlet socket 31'; as a result, since the threshold current is a default constant value, the power extension wire 3' may fail to execute its power saving function as some electrical or electronic devices electrically connected to the primary outlet socket 31'.

From above descriptions, it is clear that conventional power extension wires show drawbacks and shortcomings on electricity saving; in view of that, inventors of the present application have made great efforts to make inventive research thereon and eventually provided a power saving device capable of automatically sensing standby current.

SUMMARY OF THE INVENTION

The primary objective of the present invention is to disclose power saving device capable of automatically sensing standby current, which is used in a power device such as a power outlet or other power supply devices for giving the power device ability of electricity saving. When the power saving device normally works, a threshold current setting unit of a controlling and processing module is configured to automatically calculate a threshold current based on current signals sensed by a current detecting unit under different operation modes of at least one electrical device electrically connected to the power device. Moreover, when at least one standby current sensed from the electrical device is determined to be lower than the threshold current, the controlling and processing module immediately switches a switch unit to an open-circuit state, thereby causing the electrical device unable to receive electricity from the power device. Consequently, the power device exhibits the ability of power saving.

For achieving the primary objective of the present invention, the inventor of the present invention provides an embodiment for the power saving device capable of automatically sensing standby current, which is for use in a power device electrically connected between an electricity inputting port and a power supplying port, and comprises:

a current detecting unit, being coupled between the power supplying port and the power device; wherein an external electrical device can be electrically connected to the power supplying port for receiving a power outputted by the power device, and the current detecting unit being used for measuring a current signal from the power;

a switch unit, being coupled between the power supplying port and the current detecting unit;

a controlling and processing module, being electrically connected to the power device, the current detecting unit and the switch unit, and comprising a threshold current setting unit, a comparison unit and a microprocessor; and an activation unit, being configured for activating the controlling and processing module to switch the switch unit to a short-circuit state;

wherein the threshold current setting unit is able to calculate a threshold current level based on at least one current signal measured by the current detecting unit under different operation modes of the electrical device;

wherein the comparison unit is configured to compare the level of the current signal with the threshold current level, so as to inform the controlling and processing module to switch the switch unit to an open-circuit state under the condition that the level of the current signal is smaller than the threshold current level, thereby blocking the electrical device from receiving the power via the power supplying port.

Moreover, in order to achieve the primary objective of the present invention, the inventor of the present invention provides another one embodiment for the power saving device capable of automatically sensing standby current, which is for use in a power device electrically connected between an electricity inputting port and a power supplying port, and comprises:

a current detecting unit, being coupled between the power supplying port and the power device; wherein an external electrical device can be electrically connected to the power supplying port for receiving a power outputted by the power device, and the current detecting unit being used for measuring a current signal from the power;

a switch unit, being coupled between the electricity inputting port and the power device;

a controlling and processing module, being electrically connected to the power device, the current detecting unit and the switch unit, and comprising a threshold current setting unit, a comparison unit and a microprocessor; and an activation unit, being configured for activating the controlling and processing module to switch the switch unit to a short-circuit state;

wherein the threshold current setting unit is able to calculate a threshold current level based on at least one current signal measured by the current detecting unit under different operation modes of the electrical device;

wherein the comparison unit is configured to compare the level of the current signal with the threshold current level, so as to inform the controlling and processing module to switch the switch unit to an open-circuit state under the condition that the level of the current signal is smaller than the threshold current level, thereby blocking the electrical device from receiving the power via the power supplying port.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a power saving device capable of automatically sensing standby current according to the present invention, embodiments of the present invention will be described in detail with reference to the attached drawings hereinafter.

First Embodiment

Figure 1:
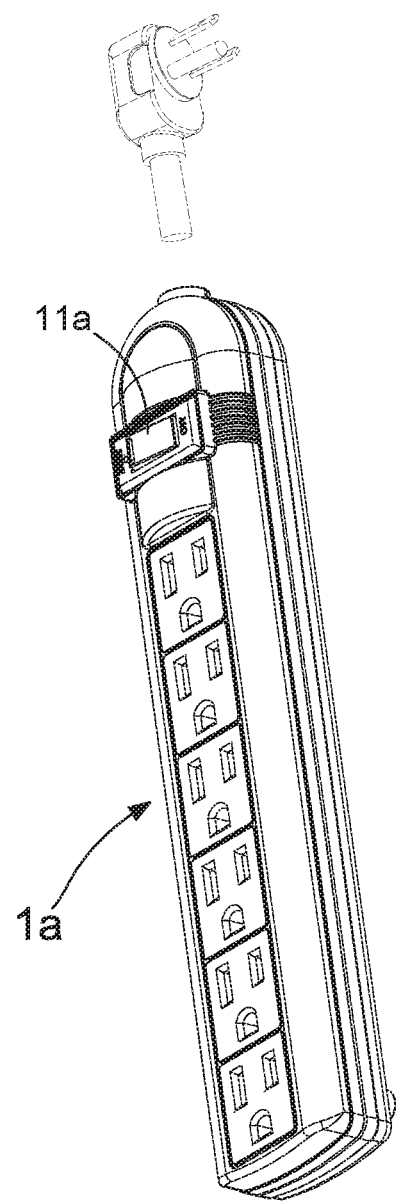
FIG. 1 shows a stereo diagram of a commercial power extension wire with multi outlet sockets.
Figure 2:
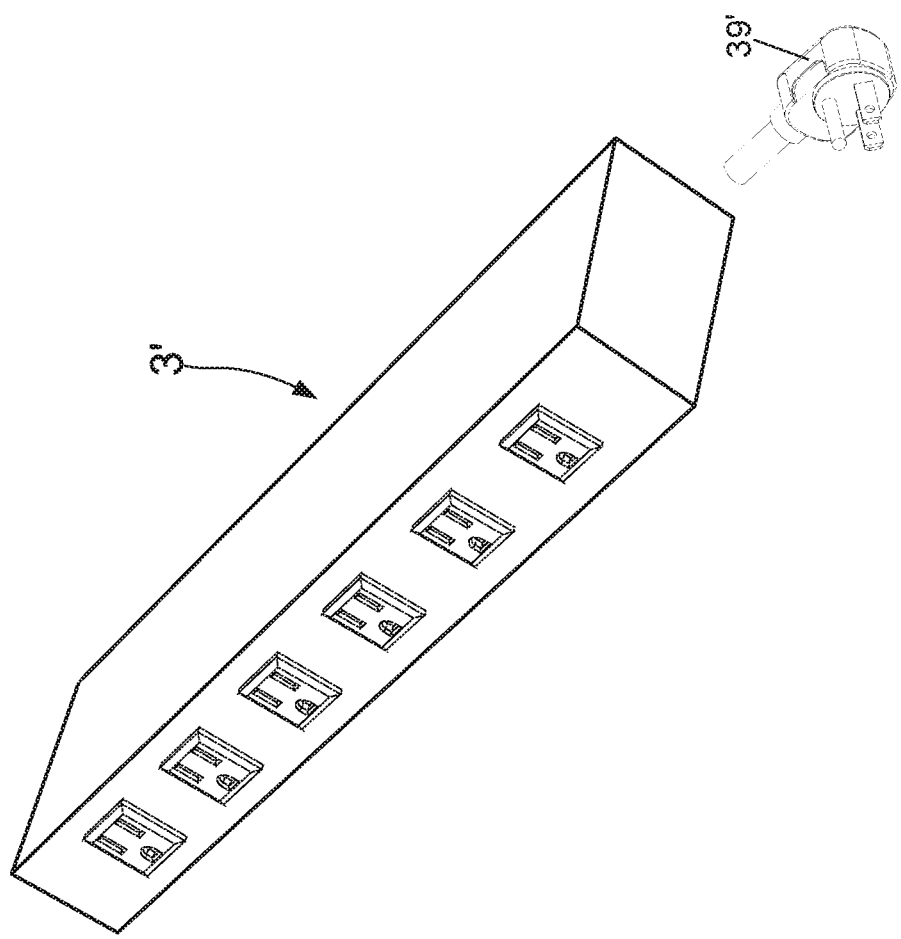
FIG. 2 shows a stereo diagram of a power extension wire having power saving function.
Figure 3:
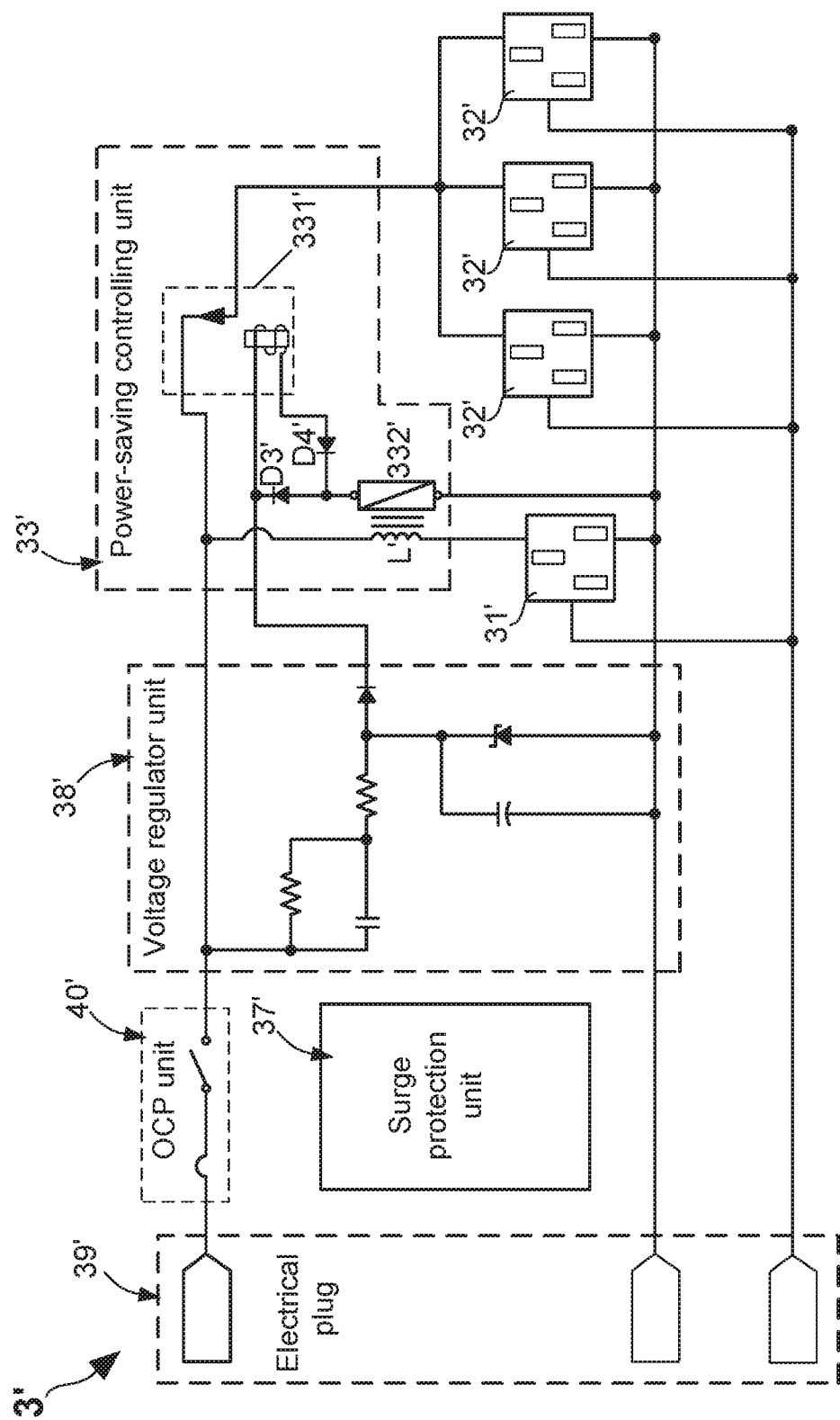
FIG. 3 shows an inner circuit topology of the power extension wire having power saving function.
Figure 4:
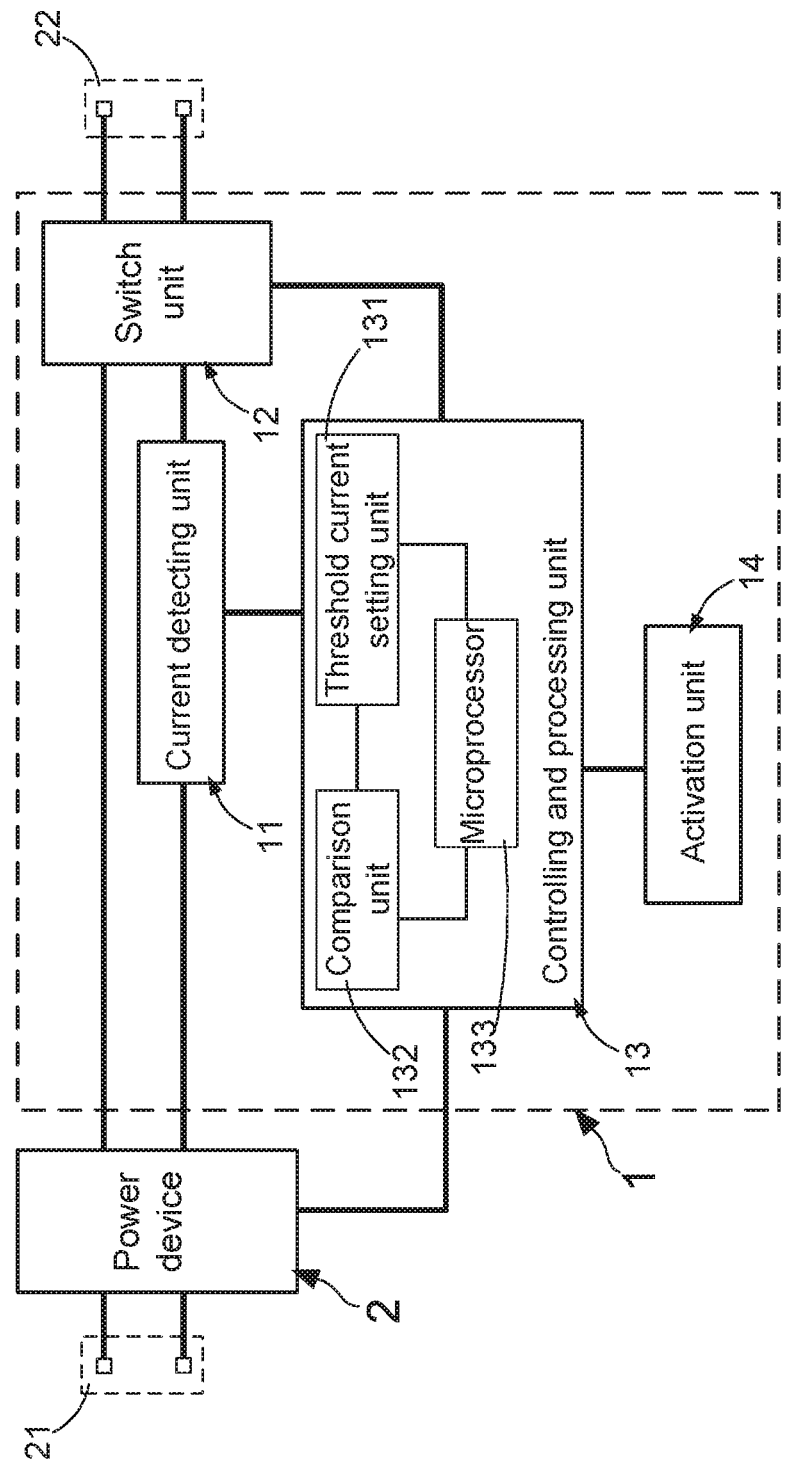
FIG. 4 shows a circuit topology diagram of a first embodiment of a power saving device capable of automatically sensing standby current according to the present invention.

With reference to FIG. 4, there is provided a circuit topology diagram of a first embodiment of a power saving device capable of automatically sensing standby current according to the present invention. As FIG. 4 shows, the power saving device 1 is for use in a power device 2 electrically connected between an electricity inputting port 21 and a power supplying port 22, wherein the power device 2 can be a power outlet socket, a power extension wire, a power converter, and a power adapter, and at least one electrical is able to receive a power from the power device 2 via the power supplying port 22. It is worth noting that, the said electrical device is one kind of load device, such as household appliance, electronic product or power converter.

From FIG. 4, it is understood that this power saving device 1 comprises: a current detecting unit 11, a switch unit 12, a controlling and processing module 13, and an activation unit 4. The current detecting unit 11 is coupled between the power supplying port 22 and the power device 2 for measuring a current signal from the power supplied by the power device 2. On the other hand, the switch unit 12 is coupled between the power supplying port 22 and the current detecting unit 11. Particularly, the controlling and processing module 13 is electrically connected to the power device 2, the current detecting unit 11 and the switch unit 12, and comprises a threshold current setting unit 131, a comparison unit 132 and a microprocessor 133.

In the present invention, the an activation unit 14 is configured for activating the controlling and processing module 13, and the switch unit 12 would be switched to a short-circuit state after the controlling and processing module 13 is activated. The said switch is not limited to be a press type switch, but can also be a switch controlled by Ethernet signal, a switch controlled by wireless signal, a switch controlled by NFC signal, or a switch controlled by infrared (IR) signal.

Figure 5:
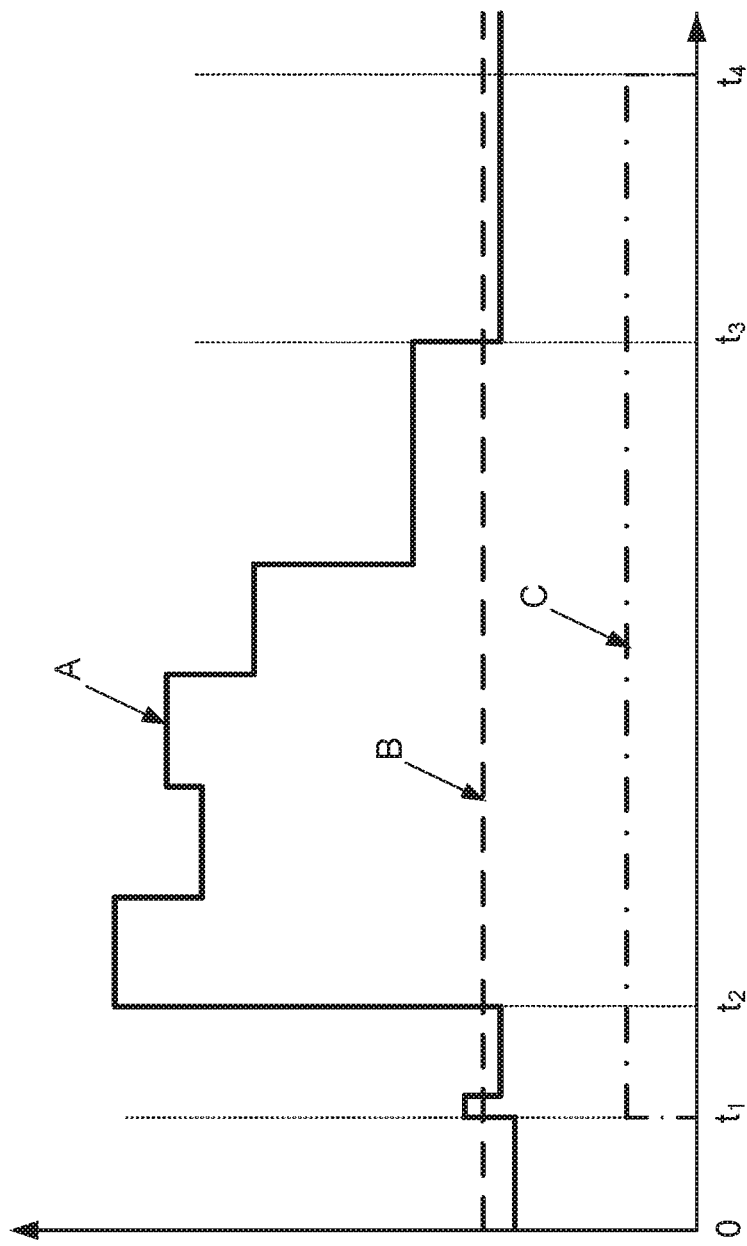
FIG. 5 shows a waveform graph.

FIG. 5 shows a waveform graph, wherein waveform graph (a) depicts a waveform of the PWM signal, waveform graph (b) represents an ideal waveform of an output voltage signal of the battery 2', and curve (a) is a real waveform of the current signal measured by the current detecting unit 11, curve (b) is a threshold current level, and curve (c) is a switch controlling signal outputted by the controlling and processing module 13 for switching the open-circuit/short-circuit states of the switch unit 12. After the controlling and processing module 13 is activated by the activation unit 14, the threshold current setting unit 13 would calculate a threshold current level like curve (b) based on at least one current signal measured by the current detecting unit 14 under different operation modes of the electrical device within a first time. In FIG. 5, the first time is a difference value between $t_2$ and $t_1$. It needs to further explain that, the threshold current setting unit 131 calculates the threshold current level by using following any one calculation ways of amplifying the current signal by an amplification ratio, adding a bias level to the level of the current signal, and applying an interpolation process to various current signal measured by the current detecting unit 11 under different operation modes of the electrical device. For instance, the said amplification ratio can be a ratio of a highest current level and a lowest current level, a ratio of the highest current level and an average current level, or a ratio of the lowest current level and the average current level calculated within the time interval between $t_2$ and $t_1$. Therefore, when the electrical device is turned off or gets into a standby mode, the comparison unit 132 would continuously compare the level of the current signal measured by the current detecting unit 11 with the threshold current level calculated by the threshold current setting unit 131, so as to inform the microprocessor 133 to switch the switch unit 12 to an open-circuit state under the condition that the level of the current signal is smaller than the threshold current level for a second time. In FIG. 5, the second time is a difference value between $t_3$ and $t_4$. As a result, the electrical device is blocked from receiving the power via the power supplying port 22.

When there are two electrical devices electrically connected to the electrical devices, it is assumable that the measured lowest current level certainly declines in the case of the number of the electrical devices operating at standby mode changing from two to one. Therefore, in order to make this power saving device 1 able to adaptively adjust the aforesaid amplification ratio, the threshold current setting unit 131 is configured to constantly determine whether the level of the measured current signal is the lowest current level during the normal operation of the controlling and processing module 13. Briefly speaking, if the threshold current setting unit 131 finds a specific measure current level is the lowest, the specific measure current level would be defined as a lowest current level, thereby obtaining an adjusted amplification ratio. For instance, the adjusted amplification ratio can be a ratio of a highest current level and a lowest current level, a ratio of the highest current level and an average current level, or a ratio of the lowest current level and the average current level calculated within the time interval between $t_2$ and $t_1$. Furthermore, the threshold current setting unit 131 calculates a modulated threshold current level by using following any one calculation ways of amplifying the current signal by the adjusted amplification ratio, adding a bias level to the lowest current level, and applying an interpolation process to various current signal measured by the current detecting unit 11 under different operation modes of the electrical device.

Figure 6A:
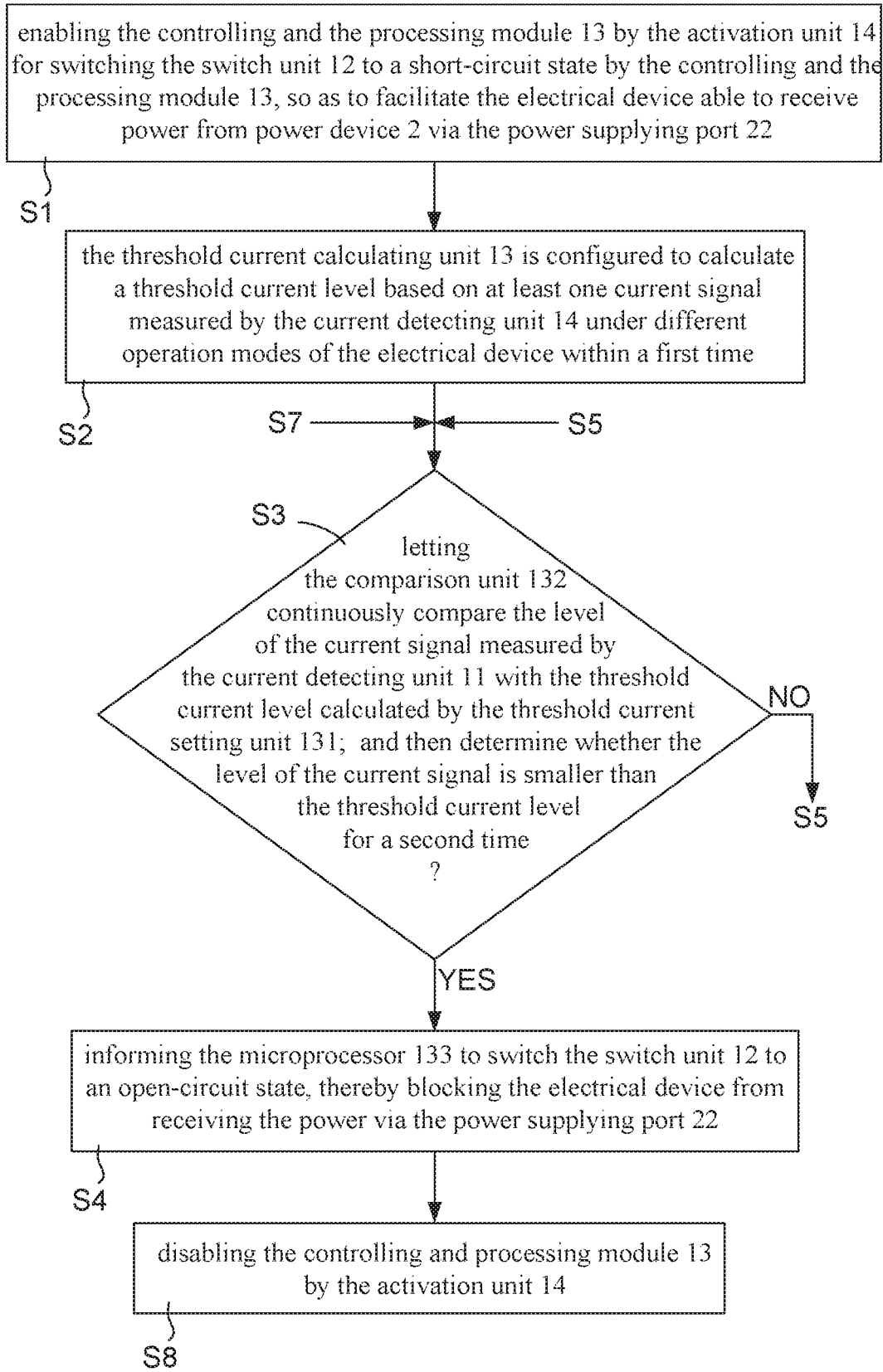
FIG. 6A and FIG. 6B show flowchart diagrams of a power-saving controlling method.
Figure 6B:
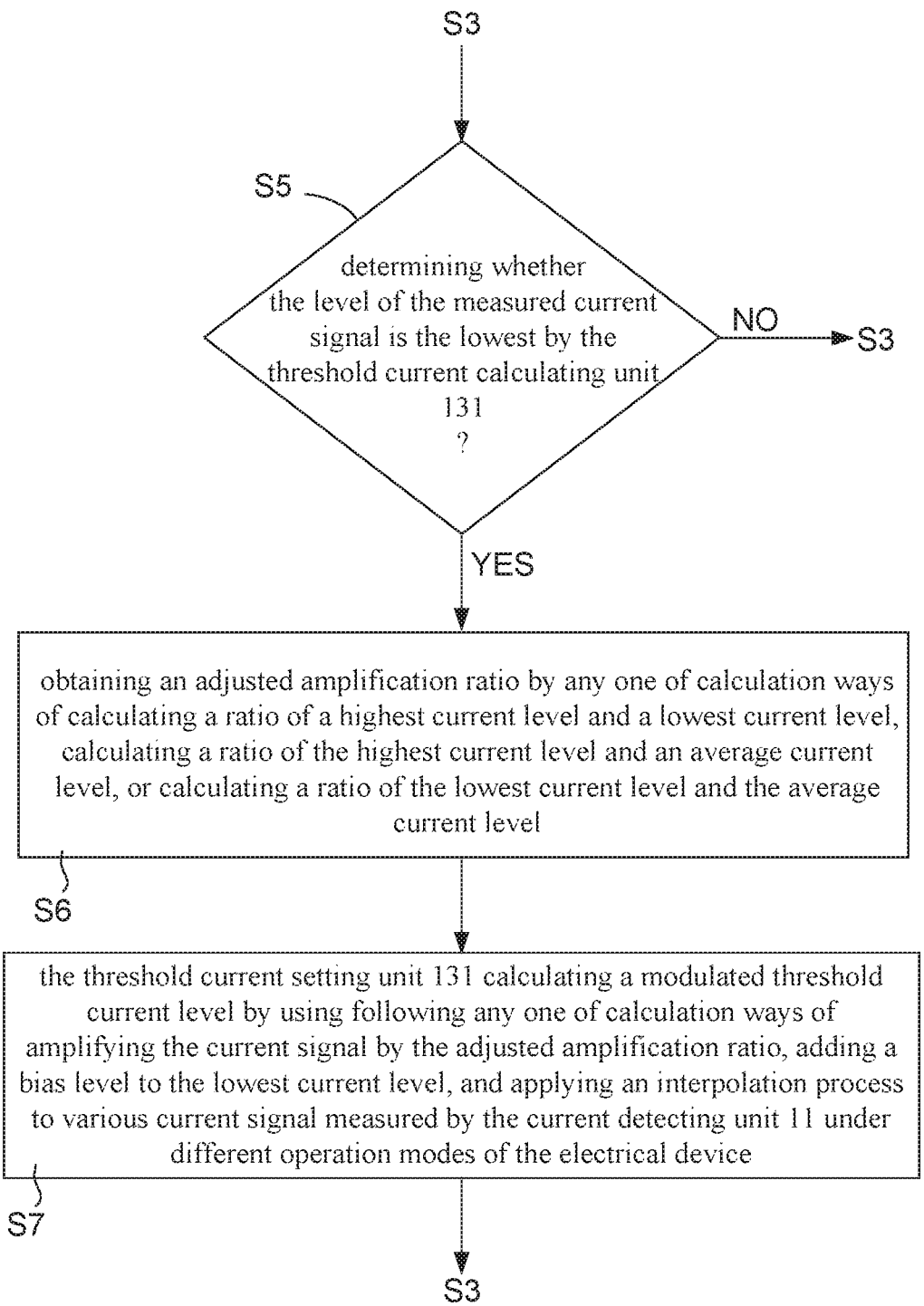

On the other hand, the present invention also provides a power-saving controlling method capable of being implemented in an execution device such as the controlling and processing module 13. This power-saving controlling method can also be established by using mathematical algorithms, so as to be embedded in the controlling and processing module 13 by a form of application program, library, variables, or operands. Referring to FIG. 4 and FIG. 5 again, and please simultaneously refer to FIG. 6A and FIG. 6B, which show flowchart diagrams of the power-saving controlling method. The power-saving controlling method mainly comprises following 7 steps:

step (S1): enabling the controlling and the processing module 13 by the activation unit 14 for switching the switch unit 12 to a short-circuit state by the controlling and the processing module 13, so as to facilitate the electrical device able to receive power from power device 2 via the power supplying port 22;

step (S2): the threshold current setting unit 13 is configured to calculate a threshold current level like curve (b) based on at least one current signal measured by the current detecting unit 14 under different operation modes of the electrical device within a first time (i.e., between $t_2$ and $t_1$);

step (S3): letting the comparison unit 132 continuously compare the level of the current signal measured by the current detecting unit 11 with the threshold current level calculated by the threshold current setting unit 131, and then determine whether the level of the current signal is smaller than the threshold current level for a second time (i.e., between $t_3$ and $t_4$); if yes, proceeding to step (S4); otherwise, proceeding to step (S5);

step (S4): informing the microprocessor 133 to switch the switch unit 12 to an open-circuit state, thereby blocking the electrical device from receiving the power via the power supplying port 22; next proceeding to step (S7);

step (S5): determining whether the level of the measured current signal is the lowest by the threshold current setting unit 131; if yes, proceeding to step (S6); otherwise, proceeding back to the step (S3);

step (S6): obtaining an adjusted amplification ratio by any one of calculation ways of calculating a ratio of a highest current level and a lowest current level, calculating a ratio of the highest current level and an average current level, or calculating a ratio of the lowest current level and the average current level;

step (S7): the threshold current setting unit 131 calculating a modulated threshold current level by using following any one of calculation ways of amplifying the current signal by the adjusted amplification ratio, adding a bias level to the lowest current level, and applying an interpolation process to various current signal measured by the current detecting unit 11 under different operation modes of the electrical device; next proceeding back to the step (S3); and step (S8): disabling the controlling and processing module 13 by the activation unit 14.

In the step (S1), the controlling and processing module 13 switches the switch unit 12 to the short-circuit state at a zero voltage switching (ZVC) point on the waveform of a voltage signal from the power outputted by the power device 2 according to a zero cross period of the voltage signal and a delay time of the switch unit 12. By such way, unwanted power consumption of the power device 2 can be prevented from being produced during the normal operation of the power saving device 1 proposed by the present invention. In step (S4), similarly, the controlling and processing module 13 switches the switch unit 12 to the open-circuit state at a zero voltage switching (ZVC) point on the waveform of a voltage signal from the power outputted by the power device 2 according to a zero cross period of the voltage signal and a delay time of the switch unit 12.

Second Embodiment

Figure 7:
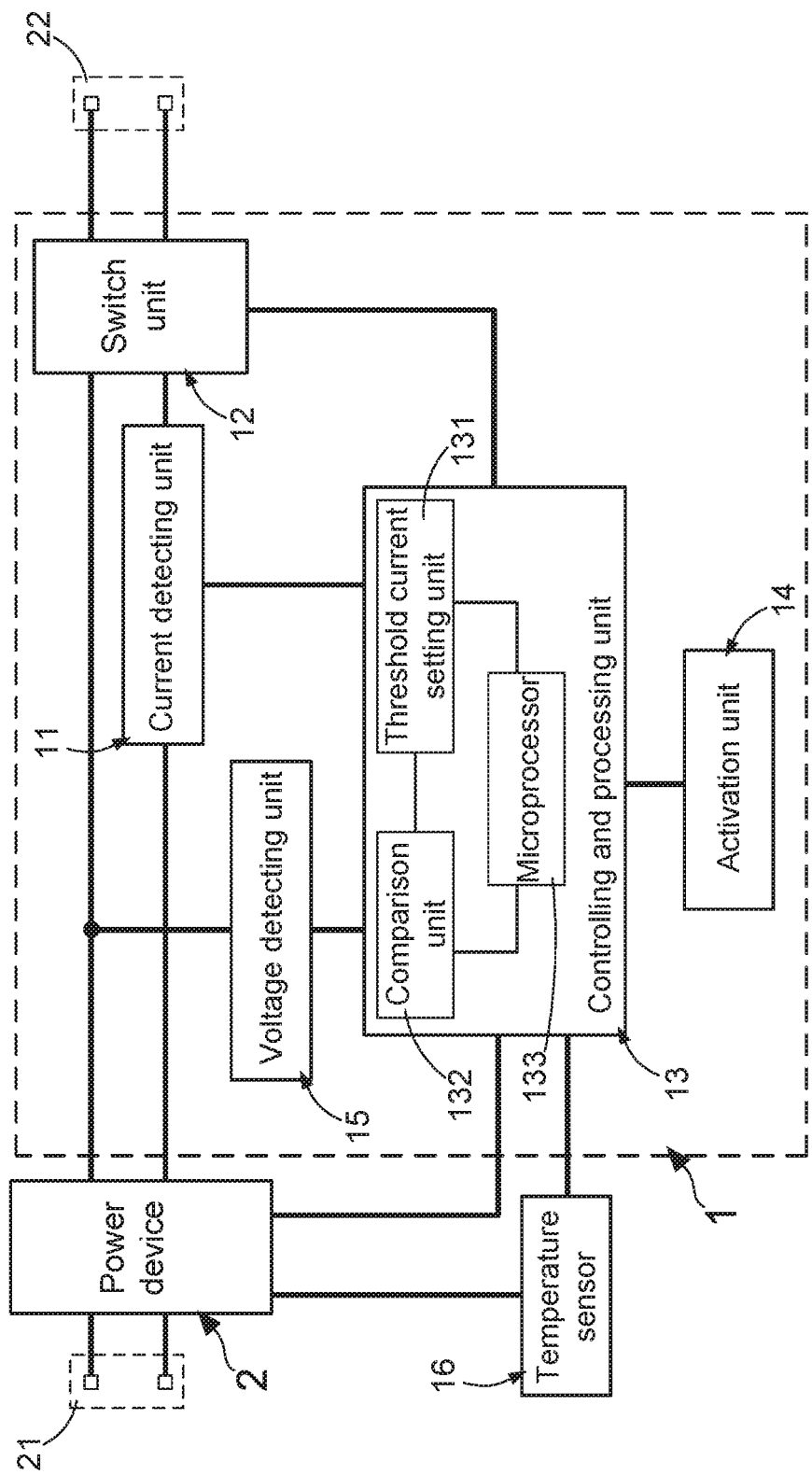
FIG. 7 shows a circuit topology diagram of a second embodiment of the power saving device capable of automatically sensing standby current.

With reference to FIG. 7, there is provided a circuit topology diagram of a second embodiment of the power saving device capable of automatically sensing standby current. After comparing FIG. 7 with FIG. 4, it is found that the second embodiment of the power saving device 1 further comprises a voltage detecting unit 15, which is coupled between the power supplying port 22 and the power device 2 for measuring a voltage signal from the power. By such arrangement, not only can the power saving device 1 calculate a threshold current level like curve (b) under different operation modes of the electrical device electrically connected to the power device 2, but the power saving device 1 can also calculates a threshold power level based on the measured voltage signal and current signal, thereby assisting the power device 2 in power saving according to standby current and/or standby power of the electrical device.

Figure 8:
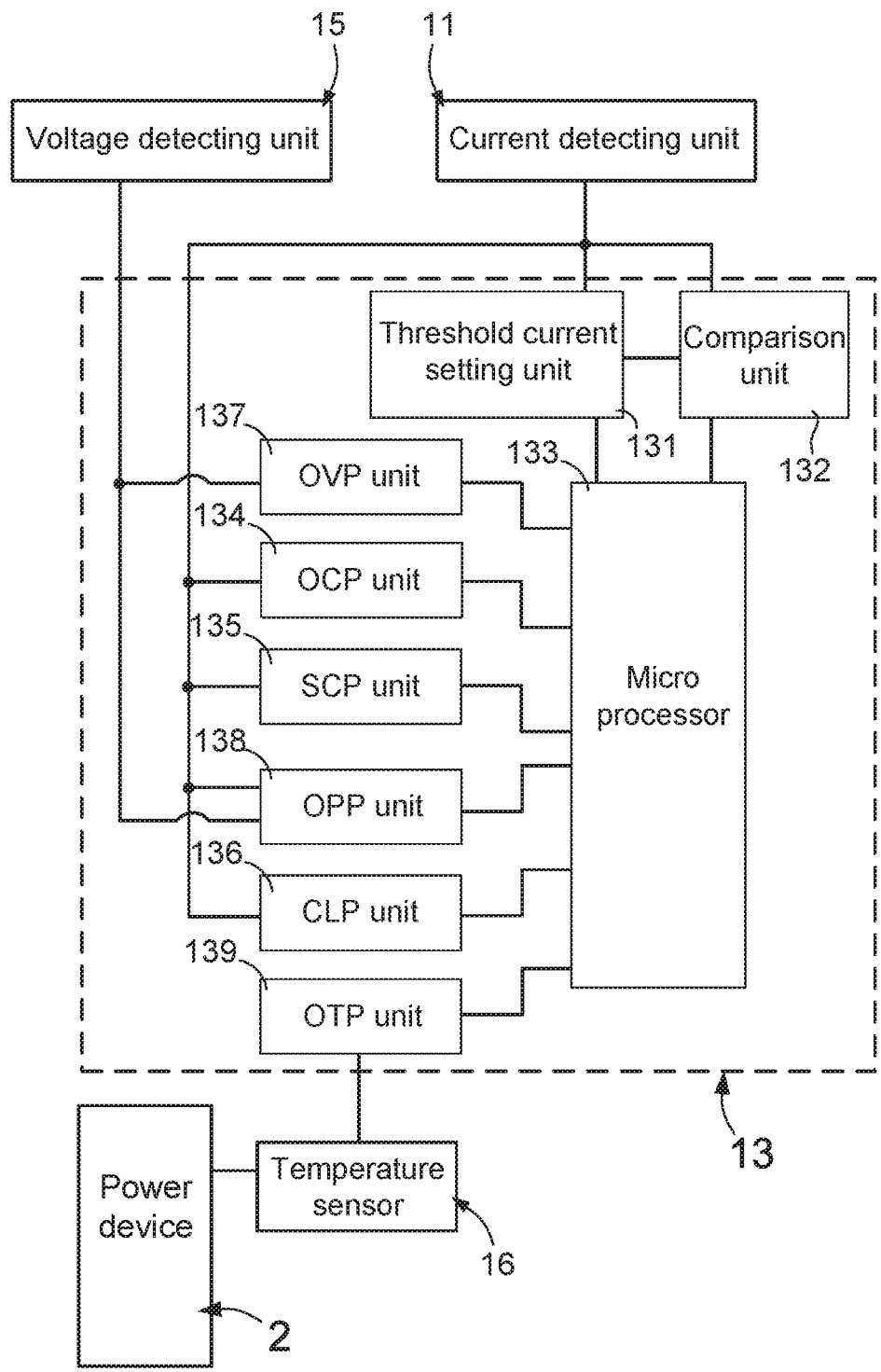
FIG. 8 shows a circuit block diagram of a controlling and processing module of the power saving device.

Continuously referring to FIG. 7, and please simultaneously refer to FIG. 8, which illustrates a circuit block diagram of the controlling and processing module. Besides the threshold current setting unit 131, the comparison unit 132 and the microprocessor 133, the circuit framework of the controlling and processing module 13 can be further expanded to include an over-current protection (OCP) unit 134, a short-circuit protection (SCP) unit 135, a current leakage protection (CLP) unit 136, an over-voltage protection (OVP) unit 137, and an over-power protection (OPP) unit 138. From FIG. 8, it is understood that all of the OCP unit 134, the SCP unit 135, the CLP unit 136, and the OPP unit 138 are coupled to the current detecting unit 11 and the microprocessor 133, and the OPP unit 138 are also coupled to the voltage detecting unit 15. Moreover, the OVP unit 137 is coupled to the Voltage detecting unit 15.

On the other hand, the power saving device 1 further includes a temperature sensor 16, which is electrically connected to the power device 2 for sensing a temperature variation of the power device 2. For communicating with the temperature sensor 16, the circuit framework of the controlling and processing module 13 is further expanded to include an over-temperature protection (OTP) unit 139.

Third Embodiment

Figure 9:
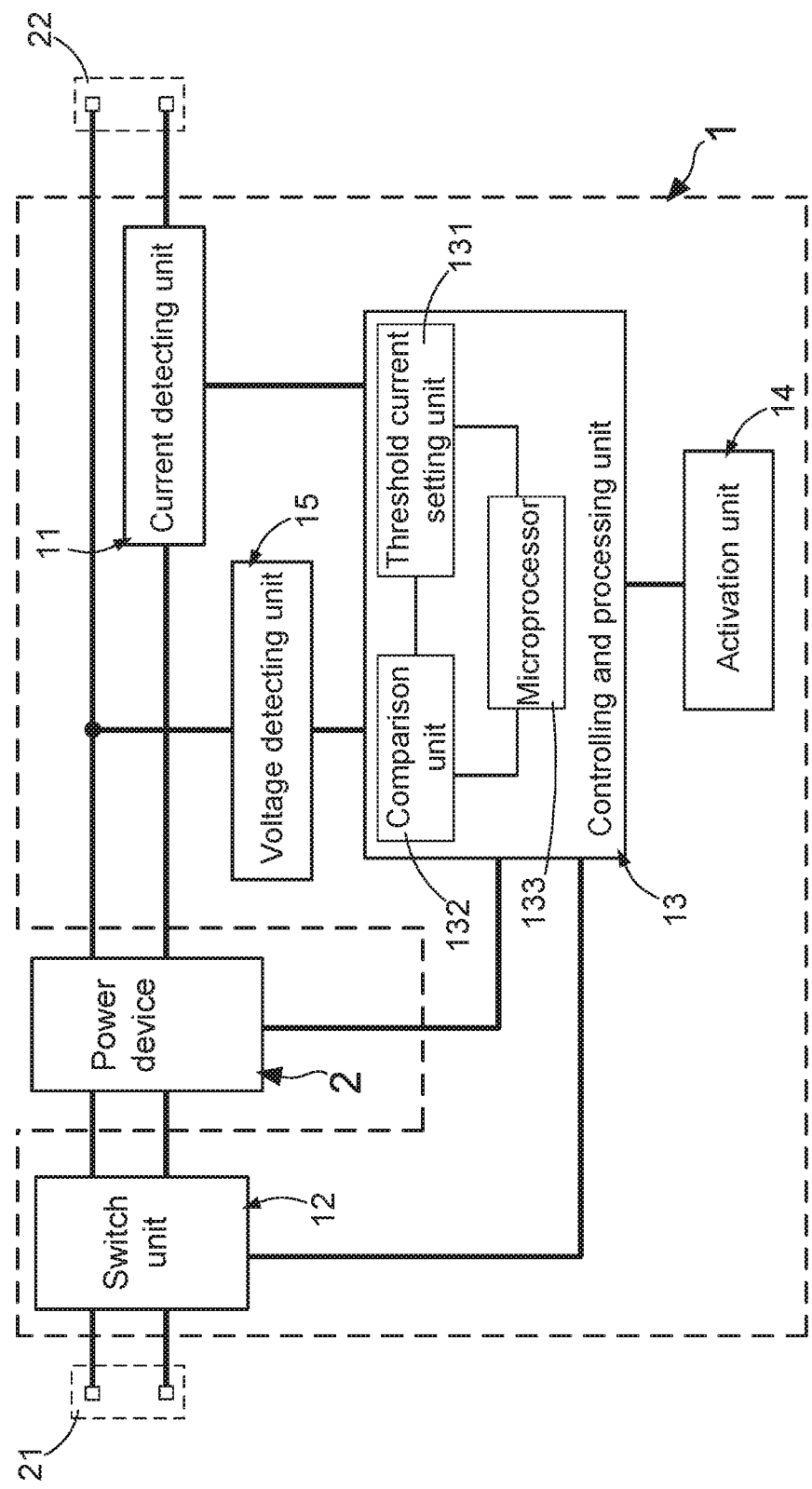
FIG. 9 shows a circuit topology diagram of a third embodiment of the power saving device.

With reference to FIG. 9, there is provided a circuit topology diagram of a third embodiment of the power saving device. After comparing FIG. 9 with FIG. 7, it is found that the switch unit 12 in the third embodiment is coupled between the electricity inputting port 21 and the power device 2. By such arrangement, after the controlling and processing module 13 switches the switch unit 12 to the open-circuit state, the power device 2 also fails to receive AC mains from the electricity inputting port 21 besides the electrical device cannot receive the power from the power device 2 via the power supplying port 22. As a result, a real zero standby power control is carried out.

Therefore, through above descriptions, the power saving device capable of automatically sensing standby current have been introduced completely and clearly; in summary, the present invention includes the advantages of:

(1) The present invention discloses a power saving device 1 capable of automatically sensing standby current, which is used in a power device 2 such as a power outlet or other power supply devices for giving the power device ability of electricity saving. When the power saving device 1 normally works, a threshold current setting unit 131 of a controlling and processing module 13 is configured to automatically calculate a threshold current based on current signals sensed by a current detecting unit 11 under different operation modes of at least one electrical device electrically connected to the power device 2. Moreover, when at least one standby current sensed from the electrical device is determined to be lower than the threshold current, the controlling and processing module 13 immediately switches a switch unit 12 to an open-circuit state, thereby causing the electrical device unable to receive electricity from the power device 2. Consequently, the power device 2 exhibits the ability of power saving.

The above description is made on embodiments of the present invention. However, the embodiments are not intended to limit scope of the present invention, and all equivalent implementations or alterations within the spirit of the present invention still fall within the scope of the present invention.

What is claimed is:

1. A power saving device capable of automatically sensing standby current, being for use in a power device electrically connected between an electricity inputting port and a power supplying port, and comprising:

a current detecting unit, being coupled between the power supplying port and the power device; wherein an external electrical device can be electrically connected to the power supplying port for receiving a power outputted by the power device, and the current detecting unit being used for measuring a current signal from the power;

a switch unit, being coupled between the power supplying port and the current detecting unit;

a controlling and processing module, being electrically connected to the power device, the current detecting unit and the switch unit, and comprising a threshold current setting unit, a comparison unit and a microprocessor; and an activation unit, being configured for activating the controlling and processing module to switch the switch unit to a short-circuit state;

wherein the threshold current setting unit is able to calculate a threshold current level based on at least one current signal measured by the current detecting unit under different operation modes of the electrical device;

wherein the comparison unit is configured to compare the level of the current signal with the threshold current level, so as to inform the controlling and processing module to switch the switch unit to an open-circuit state under the condition that the level of the current signal is smaller than the threshold current level, thereby blocking the electrical device from receiving the power via the power supplying port.

2. The power saving device of claim 1, wherein the threshold current setting unit calculates the threshold current level through a calculation process selected from the group consisting of amplifying the current signal by an amplification ratio, adding a bias level to the level of the current signal, and applying an interpolation process to various current signal measured by the current detecting unit under different operation modes of the electrical device.

3. The power saving device of claim 1, wherein the power device is selected from the group consisting of power outlet socket, power extension wire, power converter, and power adapter.

4. The power saving device of claim 1, wherein the activation unit is selected from the group consisting of press type switch, switch controlled by Ethernet signal, switch controlled by wireless signal, switch controlled by NFC signal, and switch controlled by infrared (IR) signal.

5. The power saving device of claim 1, wherein the controlling and processing module switches the switch unit to the open-circuit state at a zero voltage switching (ZVC)

point on the waveform of the current according to a zero cross period of the current and a delay time of the switch unit.

6. The power saving device of claim 1, wherein the controlling and processing module further comprises:
   an over-current protection unit, being coupled to the current detecting unit and the microprocessor;
   a short-circuit protection unit, being coupled to the current detecting unit and the microprocessor; and
   a current leakage protection unit, being coupled to the current detecting unit and the microprocessor.

7. The power saving device of claim 6, further comprising:
   a voltage detecting unit, being coupled between the power supplying port and the power device for measuring a voltage signal from the power.

8. The power saving device of claim 7, wherein the controlling and processing module further comprises:
   an over-voltage protection unit, being coupled to the voltage detecting unit and the microprocessor; and
   an over-power protection unit being coupled to the current detecting unit, the voltage detecting unit and the microprocessor.

9. The power saving device of claim 7, wherein the controlling and processing module switches the switch unit to the short-circuit state at a zero voltage switching (ZVC) point on the waveform of a voltage signal from the power outputted by the power device according to a zero cross period of the voltage signal and a delay time of the switch unit.

10. The power saving device of claim 8, further comprising:
    a temperature sensor, being electrically connected to the power device, and used for sensing a temperature variation of the power device.

11. The power saving device of claim 10, wherein the controlling and processing module further comprises:
    an over-temperature protection unit, being coupled to the temperature sensor and the microprocessor.

12. A power saving device capable of automatically sensing standby current, being for use in a power device electrically connected between an electricity inputting port and a power supplying port, and comprising:
    a current detecting unit, being coupled between the power supplying port and the power device; wherein an external electrical device can be electrically connected to the power supplying port for receiving a power outputted by the power device, and the current detecting unit being used for measuring a current signal from the power;
    a switch unit, being coupled between the electricity inputting port and the power device;
    a controlling and processing module, being electrically connected to the power device, the current detecting unit and the switch unit, and comprising a threshold current setting unit, a comparison unit and a microprocessor; and
    an activation unit, being configured for activating the controlling and processing module to switch the switch unit to a short-circuit state;
    wherein the threshold current setting unit is able to calculate a threshold current level based on at least one current signal measured by the current detecting unit under different operation modes of the electrical device;
    wherein the comparison unit is configured to compare the level of the current signal with the threshold current level, so as to inform the controlling and processing module to switch the switch unit to an open-circuit state under the condition that the level of the current signal is smaller than the threshold current level, thereby blocking the electrical device from receiving the power via the power supplying port.

13. The power saving device of claim 12, wherein the power device is selected from the group consisting of power outlet socket, power extension wire, power converter, and power adapter.

14. The power saving device of claim 12, wherein the threshold current setting unit calculates the threshold current level through a calculation process selected from the group consisting of amplifying the current signal by an amplification ratio, adding a bias level to the level of the current signal, and applying an interpolation process to various current signal measured by the current detecting unit under different operation modes of the electrical device.

15. The power saving device of claim 12, wherein the controlling and processing module switches the switch unit to the open-circuit state at a zero voltage switching (ZVC) point on the waveform of a voltage signal from the power outputted by the power device according to a zero cross period of the voltage signal and a delay time of the switch unit.

16. The power saving device of claim 12, wherein the controlling and processing module further comprises:
    an over-current protection unit, being coupled to the current detecting unit and the microprocessor;
    a short-circuit protection unit, being coupled to the current detecting unit and the microprocessor; and
    a current leakage protection unit, being coupled to the current detecting unit and the microprocessor.

17. The power saving device of claim 16, further comprising:
    a voltage detecting unit, being coupled between the power supplying port and the power device for measuring a voltage signal from the power.

18. The power saving device of claim 17, wherein the controlling and processing module further comprises:
    an over-voltage protection unit, being coupled to the voltage detecting unit and the microprocessor; and
    an over-power protection unit being coupled to the current detecting unit, the voltage detecting unit and the microprocessor.

19. The power saving device of claim 17, wherein the controlling and processing module switches the switch unit to the short-circuit state at a zero voltage switching (ZVC) point on the waveform of a voltage signal from the power outputted by the power device according to a zero cross period of the voltage signal and a delay time of the switch unit.

20. The power saving device of claim 18, further comprising:
    a temperature sensor, being electrically connected to the power device, and used for sensing a temperature variation of the power device;
    wherein the controlling and processing module further comprises an over-temperature protection unit coupled to the temperature sensor and the microprocessor.

* * * * *